United States Patent
Mashiro

(10) Patent No.: US 10,600,668 B2
(45) Date of Patent: Mar. 24, 2020

(54) ADSORPTION DEVICE, CONVEYANCE DEVICE, AND EL DEVICE MANUFACTURING DEVICE

(71) Applicant: Sharp Kabushiki Kaisha, Sakai, Osaka (JP)

(72) Inventor: Fumihiko Mashiro, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 9 days.

(21) Appl. No.: 16/069,178

(22) PCT Filed: Mar. 30, 2017

(86) PCT No.: PCT/JP2017/013182
§ 371 (c)(1),
(2) Date: Jul. 11, 2018

(87) PCT Pub. No.: WO2018/179201
PCT Pub. Date: Oct. 4, 2018

(65) Prior Publication Data
US 2019/0362999 A1    Nov. 28, 2019

(51) Int. Cl.
*H01L 21/683* (2006.01)
*H01L 21/677* (2006.01)
*H01L 51/56* (2006.01)

(52) U.S. Cl.
CPC ........ *H01L 21/683* (2013.01); *H01L 21/677* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 6,454,517 B1* | 9/2002 | Ohno | H01L 21/6838 294/188 |
| 8,903,289 B2* | 12/2014 | Yu | G03G 15/0189 193/37 |
| 9,406,539 B2* | 8/2016 | Hiroki | B65G 49/061 |
| 10,444,641 B2* | 10/2019 | Tanaka | G03F 7/70716 |
| 2013/0256964 A1 | 10/2013 | Akiyama et al. | |

FOREIGN PATENT DOCUMENTS

| | | |
|---|---|---|
| JP | 11-243135 A | 9/1999 |
| JP | 2005-255278 A | 9/2005 |
| JP | 2007-287911 A | 11/2007 |
| JP | 2009-202330 A | 9/2009 |
| JP | 2013-206975 A | 10/2013 |

OTHER PUBLICATIONS

Official Communication issued in International Patent Application No. PCT/JP2017/013182, dated Jun. 20, 2017.

* cited by examiner

*Primary Examiner* — Kavel Singh
(74) *Attorney, Agent, or Firm* — Keating & Bennett, LLP

(57) ABSTRACT

An adsorption device including one or more adsorption pads, wherein the adsorption device is configured to adsorb a lower surface film via the one or more adsorption pads, and the one or more adsorption pads are formed of a porous material having an average pore diameter of 1.0 μm or less.

7 Claims, 4 Drawing Sheets

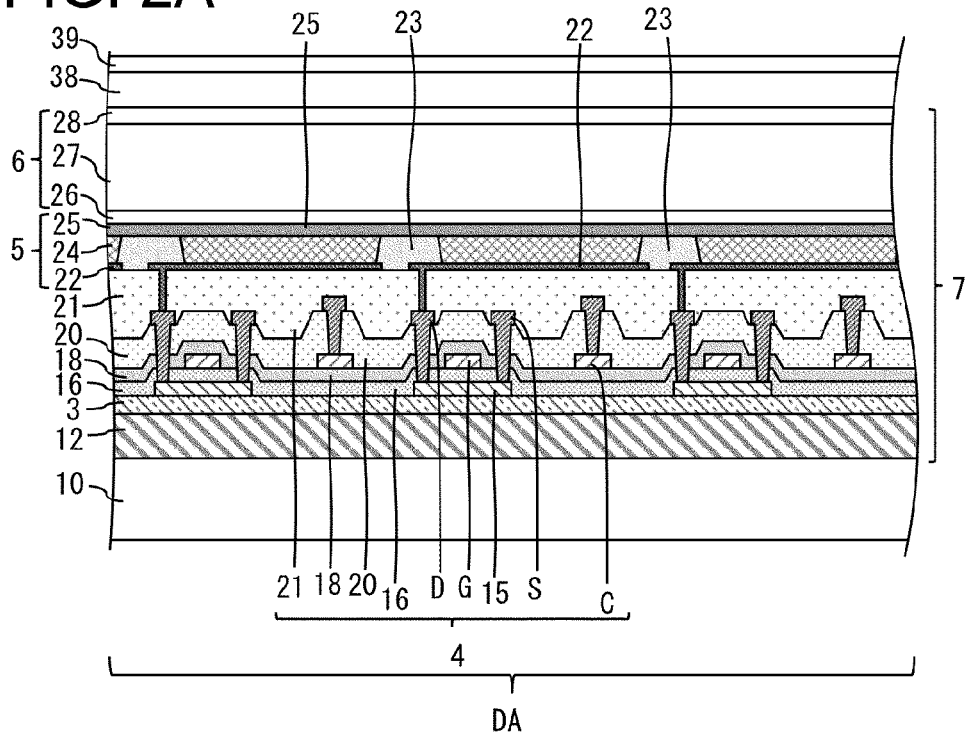
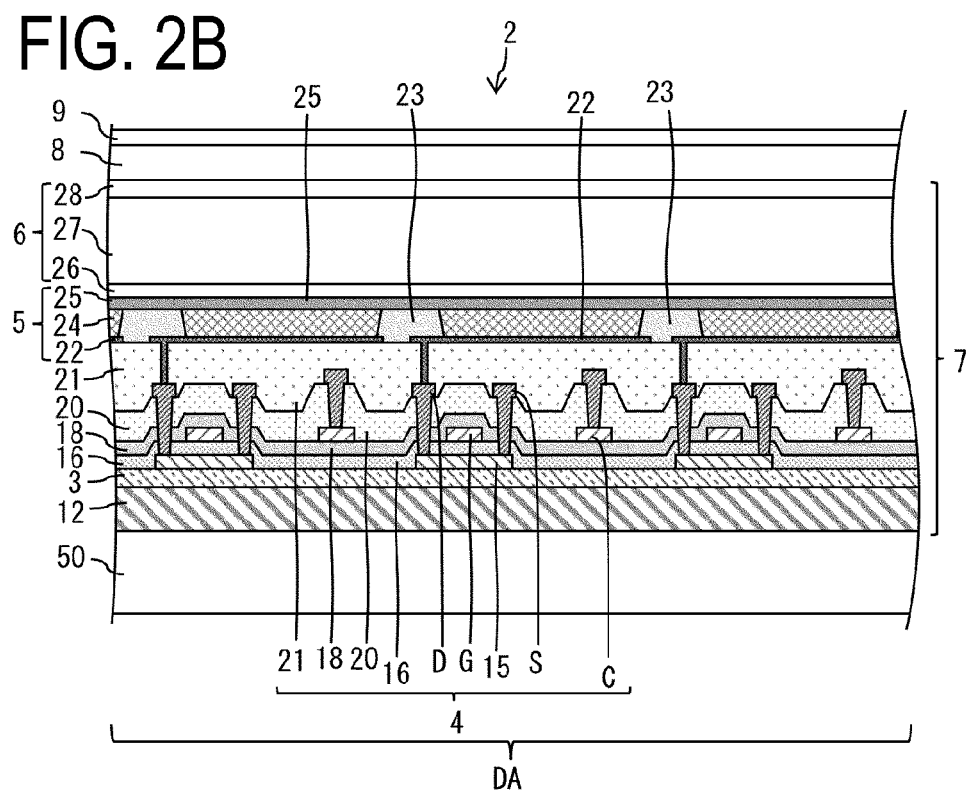

ADSORPTION DEVICE, CONVEYANCE DEVICE, AND EL DEVICE MANUFACTURING DEVICE

TECHNICAL FIELD

The disclosure relates to an adsorption device or the like for adsorbing a target object.

BACKGROUND ART

PTL 1 discloses a vacuum adsorption disc with an air-permeable porous resin layer having an average pore diameter of from 2.5 to 15 μm and a thickness width of from 0.1 to 1.0 mm for vacuum adsorbing of a workpiece (target object).

CITATION LIST

Patent Literature

PTL 1: JP 11-243135 A (published Sep. 7, 1999)

SUMMARY

Technical Problem

In the case where target objects are flexible, adsorbed locations may become deformed, which may possibly damage the target object. Accordingly, there is demand for an adsorption device capable of suppressing deformation of target objects as a result of adsorption.

Solution to Problem

To solve the above problem, an adsorption device according to one embodiment of the disclosure relates to an adsorption device including one or more adsorption pads and configured to adsorb a target object via the one or more adsorption pads, wherein the one or more adsorption pads are formed of a porous material having an average pore diameter of 1.0 μm or less.

Advantageous Effects of Disclosure

According to one embodiment of the disclosure, it is possible to suppress deformation of target objects as a result of adsorption.

BRIEF DESCRIPTION OF DRAWINGS

FIG. 2A is a cross-sectional view illustrating a configuration example of the EL device of the first embodiment. FIG. 2B is a cross-sectional view illustrating a configuration example during the process of manufacturing the EL device of the first embodiment.

DESCRIPTION OF EMBODIMENTS

Figure 1A:
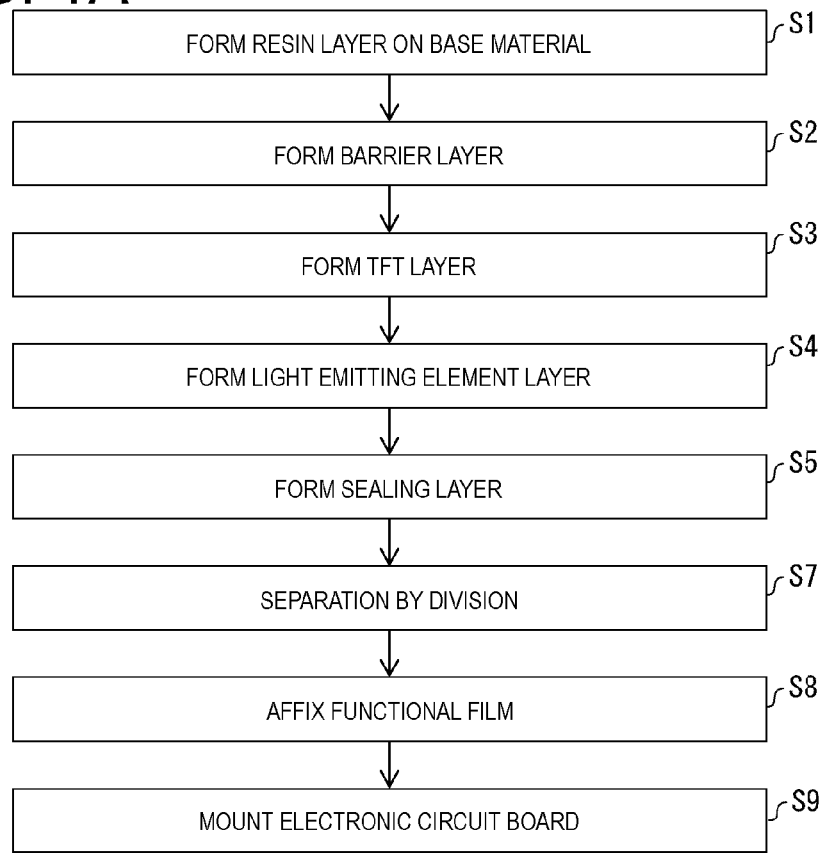
FIG. 1A is a flowchart illustrating an example of a method of manufacturing an EL device.
Figure 1B:
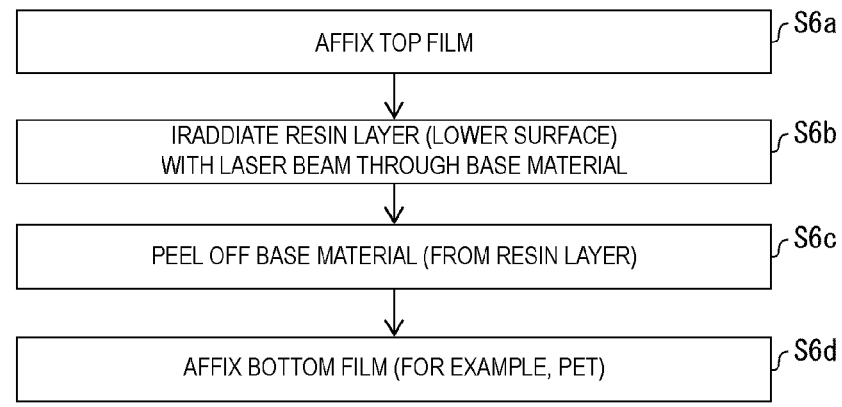
FIG. 1B is a flowchart illustrating an example of additional steps in a method of manufacturing a flexible EL device.

FIG. 1A is a flowchart illustrating an example of a method of manufacturing an EL device. FIG. 1B is a flowchart illustrating an example of additional steps in a method of manufacturing a flexible EL device. FIG. 2A is a cross-sectional view illustrating a configuration example of the EL device of the first embodiment. FIG. 2B is a cross-sectional view illustrating a configuration example during the process of manufacturing the EL device of the first embodiment.

As illustrated in FIG. 1A and FIG. 2A, first, a resin layer 12 is formed on the base material 10 (Step S1). Next, a barrier layer 3 is formed (Step S2). Next, a TFT layer 4 including a gate insulating film 16, passivation films 18 and 20, and an organic interlayer film 21 are formed (Step S3). Next, a light emitting element layer (for example, an OLED element layer) 5 is formed (Step S4). Next, a sealing layer 6 including a first inorganic sealing film 26, a second inorganic sealing film 28, and an organic sealing film 27 are formed to obtain a layered body 7 (Step S5). Next, the layered body 7 is divided and split into individual pieces along with the base material 10 (Step S7). Next, a functional film 39 is affixed via the adhesive layer 38 (Step S8). Next, an electronic circuit board is mounted on the end portion of the TFT layer 4 (Step S9). In this way, the EL device 2 illustrated in FIG. 2A is obtained. Note that each of the above steps is performed by an EL device 2 manufacturing device.

Note that, in the production of the flexible EL device 2, as illustrated in FIG. 1B and FIG. 2B, for example, the layered body 7 (the resin layer 12, the barrier layer 3, the TFT layer 4, the light emitting element layer 5 and the sealing layer 6) are formed in advance on the glass substrate 50 (Steps S1 to S5), and the upper surface film 9 is affixed on the layered body 7 via the adhesive layer 8 (Step S6a). Next, the lower surface of the resin layer 12 is irradiated with a laser beam through the glass substrate 50 (Step S6b). Here, the lower surface (the interface with the glass substrate 50) of the resin layer 12 is altered by ablation, and the bonding force between the resin layer 12 and the glass substrate 50 is reduced. Next, the glass substrate 50 is peeled from the resin layer 12 (Step S6c). Subsequently, the base material 10 (for example, a lower surface film made of PET or the like) is attached to the lower surface of the resin layer 12 via an adhesive layer (Step S6d). Thereafter, the process proceeds to Step S7.

Examples of the material of the resin layer 12 include polymide, epoxy, and polyamide. Examples of the material of the base material 10 include polyethylene terephthalate (PET). In the following description, the base material 10 may be referred to as a lower surface film 10.

The barrier layer 3 is a layer for preventing moisture and impurities from reaching the TFT layer 4 and the light emitting element layer 5 during usage of the EL device 2. The barrier layer 3 can be composed of, for example, a silicon oxide film, a silicon nitride film, a silicon oxynitride film, or a layered film thereof formed using a Chemical Vapor Deposition (CVD) method.

The TFT layer 4 includes a semiconductor film 15, a gate insulating film 16, a gate electrode G, passivation films 18 and 20, a capacity electrode C and a terminal TM, a source electrode S and a drain electrode D, and an organic interlayer film (flattening film) 21. The gate insulating film 16 is formed above the semiconductor film 15. The gate electrode G is formed above the gate insulating film 16. The passivation films 18 and 20 are formed above the gate electrode G. The capacity electrode C and the terminal TM are formed above the passivation film 18. The organic interlayer film 21 formed above the passivation film 20 is formed above the source electrode S and the drain electrode D. A thin film transistor (TFT) is configured to include the semiconductor film 15, the gate insulating film 16, and the gate electrode G. In the non-active region of the TFT layer 4, a plurality of terminals TM used for connection with the electronic circuit board are formed.

The semiconductor film 15 is formed of, for example, low temperature polysilicon (LTPS) or an oxide semiconductor. The gate insulating film 16 can be formed of, for example, a silicon oxide (SiOx) film, a silicon nitride (SiNx) film, or a layered film thereof formed using a CVD method. The gate electrode G, the source electrode S, the drain electrode D, and the terminal are formed of a metal single layer film or a layered film including, for example, at least one of aluminum (Al), tungsten (W), molybdenum (Mo), tantalum (Ta), chromium (Cr), titanium (Ti), or copper (Cu). Note that although a TFT using the semiconductor film 15 as a channel is illustrated as a top gate structure in FIG. 2A and FIG. 2B, a bottom gate structure is also possible (for example, in the case where the channel of the TFT is an oxide semiconductor).

The gate insulating film 16 and the passivation films 18 and 20 can be formed of, for example, a silicon oxide (SiOx) film, a silicon nitride (SiNx) film, or a layered film thereof formed using a CVD method. The organic interlayer film 21 can be formed of a coatable photosensitive organic material, such as polymide or acrylic, for example. The edge of the terminal TM is covered with an organic interlayer film 21.

The light emitting element layer 5 (for example, the organic light emitting diode layer) includes a first electrode 22 (for example, an anode electrode) formed above the organic interlayer film 21, an organic insulating film 23 covering an edge of the first electrode 22, an electroluminescent (EL) layer 24 formed above the first electrode 22, and a second electrode 25 formed above the EL layer 24. The first electrode 22, the EL layer 24, and the second electrode layer 25 constitute a light emitting element (for example, an organic light emitting diode). The organic insulating film 23 in the active region DA functions as a bank (pixel partition) that defines subpixels.

The organic insulating film 23 can be made of a coatable photosensitive organic material such as polymide, or acrylic, for example. For example, the organic insulating film 23 can be applied to the active region DA and the non-active region NA by an ink-jet method.

In the non-active region NA, a bank-shaped convex member TK surrounding the active region is provided. The convex member TK defines an edge of the organic sealing film 27 (for example, a film formed by an ink-jet method). The convex member TK is configured to include, for example, at least one of the organic interlayer film 21 or the organic insulating film 23.

The EL layer 24 is formed in a region (subpixel region) surrounded by the partition 23c using a vapor deposition method or an ink-jet method. In the case that the light emitting element layer 5 is an organic light emitting diode (OLED) layer, for example, the EL layer 24 is formed by layering a hole injecting layer, a hole transport layer, a light emitting layer, an electron transport layer, and an electron injecting layer from the lower layer side. Note that one or more layers of the EL layer 24 may be a shared layer (shared by a plurality of pixels).

The first electrode (anode) 22 is formed by layering of, for example, Indium Tin Oxide (ITO) and an alloy including silver (Ag), and has light reflectivity. The second electrode (for example, a cathode electrode) 25 is a shared electrode, and may be formed of a transparent metal such as Indium Tin Oxide (ITO) or Indium Zinc Oxide (IZO).

In the case that the light emitting element layer 5 is an OLED layer, holes and electrons are recombined in the EL layer 24 by the driving current between the first electrode 22 and the second electrode 25 and the excitons generated thereby fall to the ground state such that light is emitted.

The light emitting element layer 5 is not limited to OLED element configurations, and may be an inorganic light emitting diode or a quantum dot light emitting diode.

The sealing layer 6 covers the light emitting element layer 5 and prevents penetration of foreign matter, such as water and oxygen, into the light emitting element layer 5. The sealing layer 6 includes a first inorganic sealing film 26 covering the organic insulating film 23 and the second electrode 25, an organic sealing film 27 that functions as a buffer film formed above the first inorganic sealing film 26, and a second inorganic sealing film 28 covering the first inorganic sealing film 26 and the organic sealing film 27.

Each of the first inorganic sealing film 26 and the second inorganic sealing film 28 may be a silicon oxide film, a silicon nitride film, a silicon oxynitride film, or a layered film thereof formed by a CVD method using a mask. The organic sealing film 27 is a transparent organic insulating film that is thicker than the first inorganic sealing film 26 and the second inorganic sealing film 28, and may be formed of a coatable photosensitive organic material such as polymide or acrylic. For example, the first inorganic sealing film 26 is inkjet coated with an ink containing such an organic material, and subsequently cured by Ultra Violet (UV) radiation.

The functional film 39 includes, for example, an optical compensation function, a touch sensor function, a protection function, or the like. In a case that layers having one or more of these functions are layered above the light emitting element layer 5, the functional film 39 may be made thinner or removed. The electronic circuit board is, for example, an IC chip or a flexible printed circuit board (FPC) mounted on a plurality of terminals TM.

First Embodiment

Figure 3:
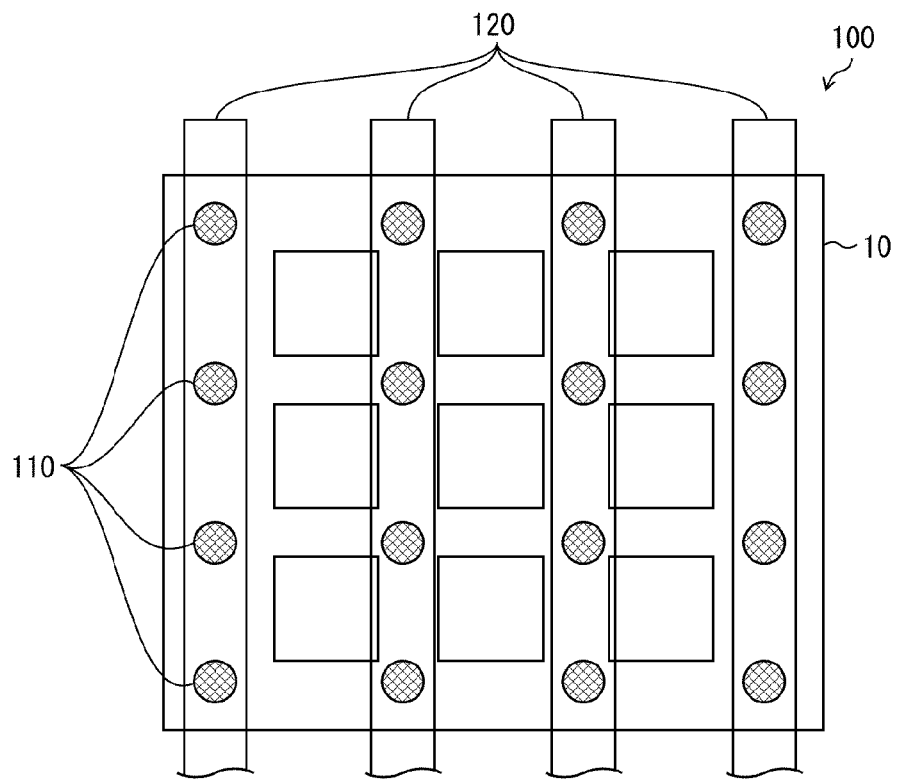
FIG. 3 is a top view of an adsorption device according to the first embodiment and a lower surface film adsorbed by the adsorption device.

FIG. 3 is a top view of an adsorption device 100 according to the present embodiment and a lower surface film 10 (target object, substrate) adsorbed by the adsorption device 100. The adsorption device 100 is provided, for example, in a conveyance device 90 (see FIG. 5) described later. Note that in addition to the lower surface film 10, the adsorption device 100 may adsorb, for example, a resin layer 12, a glass substrate 50, or alternatively a combination thereof as the target object.

As illustrated in FIG. 3, the adsorption device 100 includes sixteen adsorption units 110 and four arm units 120. The four arm units 120 are arranged in parallel and at regular intervals. The sixteen adsorption units 110 are arranged at regular intervals, with four on each of the four arm units 120. Accordingly, in the adsorption device 100, four adsorption units 110 are arranged in each of the row direction and the column direction, respectively. However, the number of the adsorption units 110 and the arm units 120 in the adsorption device 100 are not limited to the above example.

In addition, the interval between the adsorption units 110 in the respective arm units 120 is equal to the interval between the arm units 120. Accordingly, the adsorption units 110 are arranged at equal intervals in each of the row direction and the column direction.

In the present embodiment, the adsorption units 110 have a circular shape with a diameter of 40 mm. However, the shape of the adsorption units 110 is not particularly limited herein. For example, the adsorption units 110 may be elliptical, L-shaped, or X-shaped. In addition, it is not necessary that all the adsorption units 110 have the same shape, and they may have different shapes depending on their location.

The adsorption device 100 adsorbs, from the downward direction in the vertical direction, the lower surface film 10 disposed on a stage of a device for manufacturing the EL device 2 included in the EL device manufacturing device 70 to be described later (see FIG. 5). In particular, a number of grooves corresponding to the number of arm units 120 (four in FIG. 3) of the adsorption device 100 are provided on the stage in advance. In the case of adsorbing the lower surface film 10 with the adsorption device 100, an adsorption pump (not illustrated) connected to the adsorption unit 110 is run in a state where four arm units are inserted into the grooves and the adsorption unit 110 is brought into contact with the lower surface film 10. As a result, the lower surface film 10 is adsorbed downward in the vertical direction.

Figure 4:
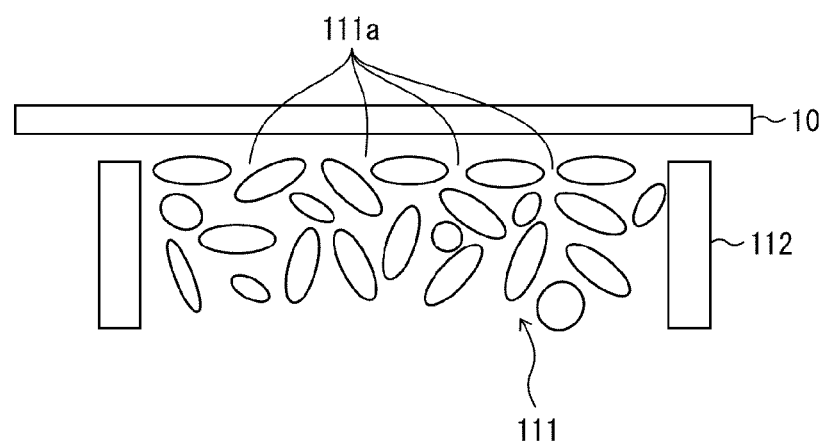
FIG. 4 is a cross-sectional view illustrating the structure of an adsorption unit of the adsorption device.

FIG. 4 is a cross-sectional view illustrating the structure of an adsorption unit 110 of the adsorption device 100. In addition, FIG. 4 also illustrates the lower surface film 10 adsorbed by the adsorption device 100. As illustrated in FIG. 4, the adsorption unit 110 includes adsorption pads 111 and a frame body 112 that supports the absorption pads 111. The material of the frame body 112 is not particularly limited, but may be, for example, a resin or the like. The adsorption device 100 adsorbs the lower surface film 10 via the adsorption pads 111.

The adsorption pads 111 are formed of a porous material having a large number of pores 111a. In the present embodiment, the porous material includes polyimide as a material. Accordingly, the adhesion between the adsorption pads 111 and the lower surface film 10 is improved.

In the present embodiment, the average pore diameter of the pores 111a is 0.3 μm. However, the average pore diameter of the pores 111a is not limited to 0.3 μm, but may, for example, be 100 μm or less. Additionally, the average pore diameter is 1.0 μm or less, and more preferably from 0.1 μm to 0.5 μm. In addition, the porosity of the adsorption pad 111 may be, for example 40%. Further, the opening ratio of the adsorption pads 111 is preferably from 30% to 50%, for example 40%, such that the lower surface film 10 can be adsorbed with an appropriate adsorption force. As such porous materials are commercially available, a description of a method for manufacturing such a porous material will be omitted in the present specification.

In the cases where a porous material having a large hole diameter as described in PTL 1 is used as an adsorption pad and a flexible target object such as the lower surface film 10 is adsorbed, the lower surface film 10 may be deformed and damaged by the adsorption. When the lower surface film 10 is damaged, the yield of the EL devices 2 is lowered.

In the adsorption device 100 of the present embodiment, the adsorption pad 111 is formed of a porous material having an average pore diameter of 0.3 μm. Accordingly, the adsorption pad 111 adsorbs the lower surface film 10 not to the "points" of the pores 111a, but to the "surface" of the entire adsorption pad 111. Therefore, using the adsorption device 100, deformation of the lower surface film 10 by adsorption and damage to the lower surface film 10 caused by this deformation are suppressed.

In addition, the adsorption device 100 of the present embodiment includes a plurality of adsorption pads 111, and adsorbs a plurality of locations of the lower surface film 10 with the plurality of adsorption pads 111. In particular, in this way, the lower surface film 10 can be adsorbed even in the case where the adsorption pads 111 cannot be brought into contact with at least a portion of the lower surface film 10, such as when a lower surface film 10 placed on a stage is adsorbed from below.

In addition, as described above, because a plurality (four in the above example) of the adsorbing units 110 are arranged in the row direction and the column direction of the EL device 2, a plurality of adsorption pads 111 are also arranged in the row direction and the column direction of the EL device 2. Accordingly, when a plurality of EL devices 2 are formed in the row direction and the column direction on the lower surface film 10, the lower surface film 10 can be adsorbed by the adsorption pad 111 with consideration for the positional relationship with the EL device 2 (for example, to avoid the active region).

In addition, as described above, because the adsorption units 110 are arranged at equal intervals, the adsorption pads 111 are also arranged at equal intervals. Accordingly, the adsorption force by the adsorption device 100 on the lower surface film 10 becomes uniform, and thus the lower surface film 10 becomes less likely to peel off from the adsorption device 100.

In addition, the adsorption surface on which the adsorption pad 111 adsorbs the lower surface film 10 faces upward in the vertical direction. In this way, as described above, the adsorption device 100 can adsorb the lower surface film 10 arranged on the stage from the lower direction in the vertical direction.

Figure 5:
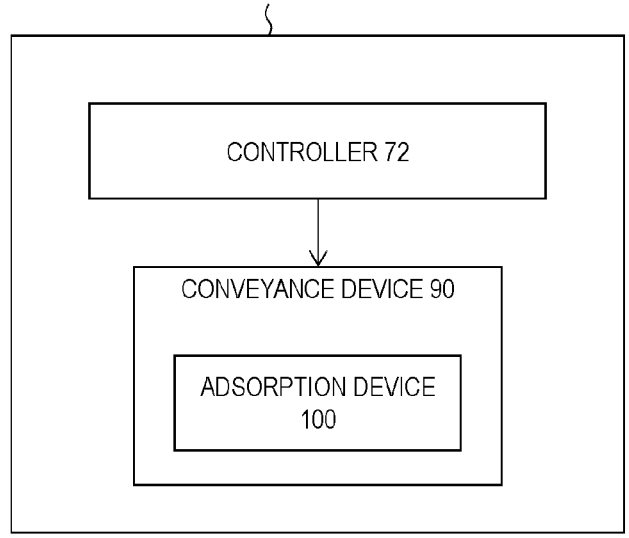
FIG. 5 is a block diagram illustrating a configuration of an EL device manufacturing device including a conveyance device including an adsorption device.

FIG. 5 is a block diagram illustrating a configuration of an EL device manufacturing device 70 including a conveyance device 90 including an adsorption device 100. As illustrated in FIG. 5, the EL device manufacturing device 70 includes a conveyance device 90 and a controller 72. The controller 72 controls the conveyance device 90 and a plurality of devices (not illustrated) used for manufacturing the EL devices 2.

The plurality of devices under the control of the controller 72 perform the processes of Steps S1 to S5, S6a to S6d, and S7 to S9 as illustrated in FIGS. 1A and 1B, whereby the EL device manufacturing device 70 manufactures flexible EL devices 2. From among the plurality of devices, the conveyance unit 90 adsorbs and conveys a conveyance target including the lower surface film 10 by using the adsorption device 100. Accordingly, in the EL device manufacturing device 70, deformation of the lower surface film 10 and the like can be suppressed during conveyance of the lower surface film 10 and the like in the manufacturing process of the EL devices 2.

Note that, in addition to the EL device, the adsorption device 100 may be provided in a manufacturing device of flexible display panels having light emitting elements. These light emitting elements are light emitting elements whose luminance and transmittance are controlled by an electric current. Examples of current-controlled light emitting elements include organic Electro Luminescence (EL) displays equipped with Organic Light Emitting Diodes (OLED), EL displays such as inorganic EL displays provided with inorganic light emitting diodes, and Quantum Dot Light Emitting Diode (QLED) displays equipped with QLED.

Second Embodiment

As described above, by using the adsorption device 100, deformation of the lower surface film 10 by adsorption and damage to the lower surface film 10 as a result of this deformation are suppressed. However, depending on the region of the lower surface film 10 to which the adsorption device 100 adsorbs, the yield of the EL devices 2 may decrease even though the damage is suppressed.

Accordingly, the adsorption force for adsorbing the lower surface film 10 can be individually set for each of the adsorption units 110 of the adsorption device 100 of the present embodiment. In particular, for example, a valve with an adjustable aperture may be provided between each of the adsorption units 110 and the adsorption pump. Alternatively, a separate adsorption pump may be connected to each of the adsorption units 110.

According to the adsorption device 100 of the present embodiment, because locations of the lower surface film 10 where deformation is particularly undesirable are not absorbed, it is possible to adsorb the lower surface film 10 without causing deformation due to adsorption. In particular, in the EL device manufacturing device 70 that uses the conveyance device 90 equipped with the adsorption device 100 of the present embodiment, the adsorption pad 111 does not adsorb the region of the lower surface film 10 corresponding to the active region (display portion) of the EL device 2. In contrast, the adsorption pad 111 adsorbs a plurality of locations of a region of the lower surface film 10 corresponding to a non-active region (non-display portion) of the EL device 2. Therefore, according to the EL device manufacturing device 70 of the present embodiment, deformation due to adsorption can be eliminated in regions of the lower surface film 10 corresponding to the active region of the EL device 2. Alternatively, the adsorption device 100 of the present embodiment may set an adsorption force for each adsorption pad 111 according to an allowable degree of deformation for each region of the lower surface film 10.

Figure 6:
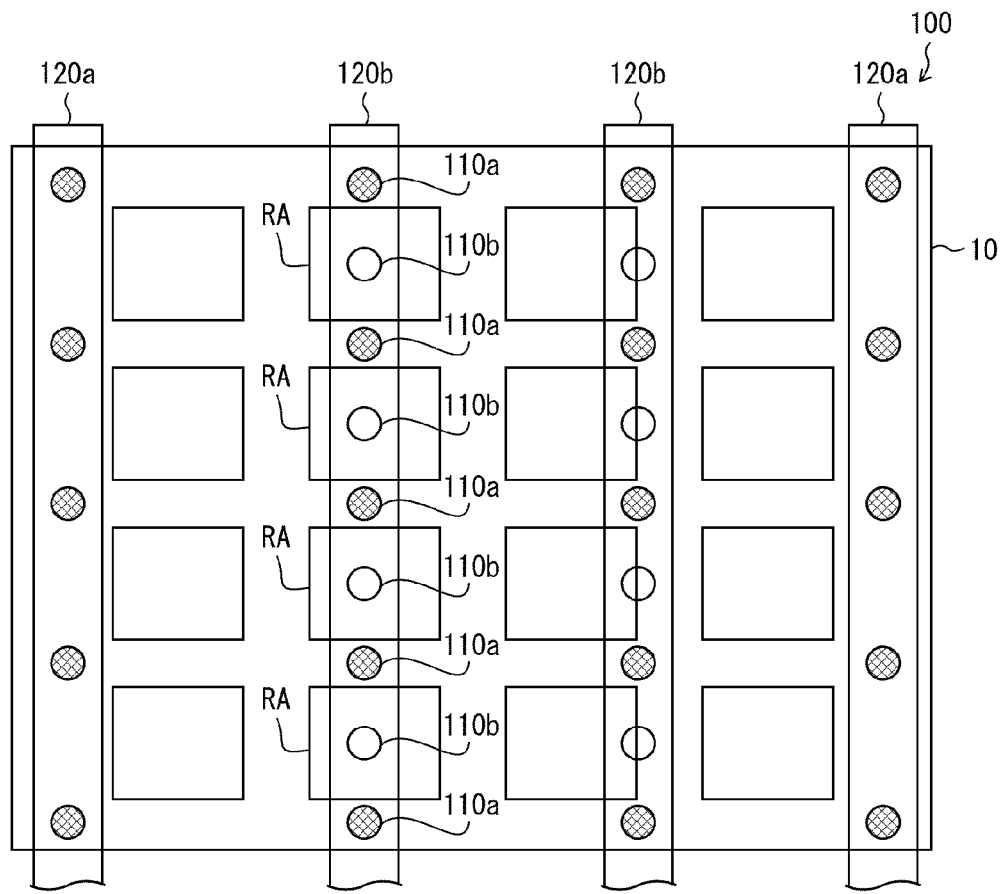
FIG. 6 is a diagram illustrating an example of setting the adsorption force for each adsorption unit.

FIG. 6 is a diagram illustrating an example of setting the adsorption force for each adsorption pad 111, or in other words, for each adsorption unit 110. In the example illustrated in FIG. 6, as the arm unit 120, the adsorption device 100 includes arm units 120a positioned at both ends and arm units 120b positioned on the inner side. The arm units 120b are provided with a larger number of adsorption units 110 than the number of adsorption units 110 (that is, adsorption pads 111) provided on the arm units 120a. In addition, the adsorption device 100 includes a controller (not illustrated) capable of adjusting the aperture of a valve (not illustrated) provided in each of the adsorption units 110.

A portion of the adsorption unit 110 provided on the arm units 120b overlaps with the active region RA (display portion) of the lower surface film 10. In FIG. 6, the adsorption units 110 that do not overlap with the active region RA are denoted as adsorption units 110a, and the adsorption units 110 that overlap with the active region RA are denoted as adsorption units 110b.

In this case, for example, the controller preemptively acquires information on the position of the active region RA of the lower surface film 10, closes the valve in the adsorption units 110b, and opens the valve in the adsorption units 110a. In this way, because the adsorption units 110b cannot adsorb the active region RA, deformation does not occur in the active region RA. In contrast, as the adsorption units 110a can adsorb regions other than the active region RA, the adsorption unit 100 can adsorb the lower surface film 10.

Note that in such an example, the number of arm units 120 of the adsorption device 100 is not limited to the above example. Because a different number of adsorption units 110 are provided for the arm units 120a positioned at both ends and the arm units 120b positioned on the inner side, the number of arm units 120 may be three or more. In addition, the adsorption units 110 of the arm units 120b positioned on the inner side may be smaller than the adsorption units 110 of the arm units 120a positioned at both ends.

In addition, the lower surface film 10 may be processed on either a first surface, which is a surface opposite to the surface adsorbed by the adsorption pad 111, or on a second surface (that is, the surface on which the adsorption pad 111 is adsorbed) which is opposite to the first surface. When the second surface is processed, a portion of the second surface other than the portion where the adsorption pad 111 is adsorbed is a target processing area. Conversely, when the lower surface film 10 is processed on the second surface, the adsorption pad 111 is arranged in the adsorption device 100 to adsorb while avoiding the target processing region of the lower surface film 10.

Supplement

An adsorption device according to a first aspect includes one or more adsorption pads, wherein the adsorption device is configured to adsorb a target object via the one or more adsorption pads, and the one or more adsorption pads are formed of a porous material having an average pore diameter of 1.0 µm or less.

In a second aspect, the adsorption device includes a plurality of adsorption pads, wherein the plurality of adsorption pads adsorb a plurality of locations of the target object.

In a third aspect, an adsorption force for adsorbing the target object can be individually set for each of the plurality of adsorption pads.

In a fourth aspect, the plurality of adsorption pads are arranged at regular intervals.

In a fifth aspect, the adsorption device further includes three or more arm units on which the plurality of adsorption pads are provided, wherein among the three or more arm units, a greater number of adsorption pads are provided on an inner arm unit than the adsorption pads provided on arm units positioned at both ends.

In a sixth aspect, an adsorption surface on which the adsorption pad adsorbs the target object faces upward in a vertical direction.

In a seventh aspect, the average pore diameter is from 0.1 µm to 0.5 µm.

In an eighth aspect, the porous material includes polyimide as a material.

In a ninth aspect, a porosity of the porous material is from 30% to 50%.

A conveyance device according to a tenth aspect includes the adsorption device of any one of the first to ninth aspects; and is configured to convey a target object adsorbed by the adsorption device.

An EL device manufacturing device of an eleventh aspect includes the conveyance device of the tenth aspect, wherein the target object is a substrate of an EL device.

In a twelfth aspect, a plurality of the adsorption pads are arranged in each of a row direction and a column direction of the EL device.

In a thirteenth aspect, the plurality of adsorption pads adsorb a plurality of locations of a region of the target object corresponding to a non-display portion of the EL device without adsorbing a region of the target object corresponding to a display portion of the EL device.

The present disclosure is not limited to each of the embodiments stated above, and various modifications may be implemented within a range not departing from the scope of the claims. Embodiments obtained by appropriately combining technical approaches stated in each of the different embodiments also fall within the scope of the technology of the present disclosure. Moreover, novel technical features may be formed by combining the technical approaches stated in each of the embodiments.

REFERENCE SIGNS LIST

10 Lower surface film (target object, substrate)
70 EL device manufacturing device
90 Conveyance device
100 Adsorption device
111 Adsorption pad
120, 120a, 120b Arm unit
RA Active region (display unit)

The invention claimed is:

1. An adsorption device comprising:
   one or more adsorption pads,
   wherein the adsorption device is configured to adsorb a target object via the one or more adsorption pads,
   the one or more adsorption pads are formed of a porous material having an average pore diameter of 1.0 μm or less,
   the adsorption device comprises a plurality of adsorption pads,
   wherein the plurality of adsorption pads adsorb a plurality of locations of the target object, and
   the adsorption device is configured to allow an adsorption force for adsorbing the target object to be individually set for each of the plurality of adsorption pads.

2. The adsorption device according to claim 1, wherein the plurality of adsorption pads are arranged at regular intervals.

3. The adsorption device according to claim 1, further comprising:
   three or more arm units on which the plurality of adsorption pads are provided,
   wherein the three or more arm units includes both end arm units positioned at both ends and one or more inner arm units positioned inside the both end arm units, the one or more inner arm units are provided with a larger number of adsorption units than a number of adsorption units provided on the both end arm units.

4. The adsorption device according to claim 1, wherein an adsorption surface on which the adsorption pads adsorb the target object faces upward in a vertical direction.

5. The adsorption device according to claim 1, wherein the average pore diameter is from 0.1 μm to 0.5 μm.

6. The adsorption device according to claim 1, wherein the porous material includes polyimide as a material.

7. The adsorption device according to claim 1, wherein a porosity of the porous material is from 30% to 50%.

* * * * *